United States Patent [19] Veys

[11] 4,408,156

[45] Oct. 4, 1983

[54] SHEET ARTICLES OF NON-CONDUCTIVE MATERIAL MARKED FOR IDENTIFICATION PURPOSES, AND METHOD AND APPARATUS FOR IDENTIFYING SUCH ARTICLES

[75] Inventor: Pierre Veys, Wexford, Pa.

[73] Assignee: N. V. Bekaert S.A., Zweuegem, Belgium

[21] Appl. No.: 138,738

[22] Filed: Apr. 9, 1980

[30] Foreign Application Priority Data

May 5, 1979 [GB] United Kingdom ................. 7915193

[51] Int. Cl.[3] ............................................ G01R 27/04

[52] U.S. Cl. ................................ 324/58.5 R; 340/600

[58] Field of Search ...................... 324/58.5 R, 58.5 A, 324/58.5 B; 340/600

[56] References Cited

U.S. PATENT DOCUMENTS

| | | | |
|---|---|---|---|
| 3,144,601 | 8/1964 | Slabodsky | 324/58.5 B |
| 3,437,923 | 4/1969 | Lucas et al. | 324/58.5 B |
| 3,766,452 | 10/1973 | Burpee et al. | |
| 3,812,423 | 5/1974 | Cronson et al. | 324/58.5 A |

FOREIGN PATENT DOCUMENTS

| | | |
|---|---|---|
| 2309278 | 5/1974 | Fed. Rep. of Germany . |
| 1570807 | 6/1969 | France . |
| 2275359 | 6/1974 | France . |
| 2422210 | 3/1979 | France . |
| 472081 | 6/1969 | Switzerland . |
| 595764 | 12/1947 | United Kingdom . |

*Primary Examiner*—Stanley T. Krawczewicz
*Attorney, Agent, or Firm*—Edward J. Brenner

[57] ABSTRACT

A method of producing an identification signal for a sheet article of non-conductive material, which article is marked for identification purposes by the incorporation therein of a small quantity of very thin conductive fibers which are capable of absorbing and reflecting certain substantial proportions of microwave radiation energy impinging thereon, which comprise placing the part of said article in which the very thin conductive fibers are incorporated in the path of an unguided microwave beam, measuring the excess of microwave radiation energy arrested over the energy reflected and producing an output signal which is representative of the presence of such excess.

11 Claims, 1 Drawing Figure

SHEET ARTICLES OF NON-CONDUCTIVE MATERIAL MARKED FOR IDENTIFICATION PURPOSES, AND METHOD AND APPARATUS FOR IDENTIFYING SUCH ARTICLES

BACKGROUND OF THE INVENTION

This invention relates to the marking for identification purposes of sheet articles of non-conductive material, particularly such articles which are in paper sheet form e.g. banknotes, passports and bonds.

One method of marking articles of paper sheet material so that the articles can be identified and their authenticity thereby checked involves the incorporation herein of a detectable material which however must not alter too much the appearance and properties of the article. The proportion of detectable material incorporated into the articles must therefore in general be small. Furthermore, it is generally desirable that the detection system by very sensitive, that it be capable of rapid response in order to allow identification of the article at high speeds, and that it should provide a reliable means for repeated identifications of the same articles. Finally, it is also desirable that the detectable material be capable of producing a specific response, which can difficultly be imitated by other materials, in order to avoid successful counterfeiting of the markings.

SUMMARY OF THE INVENTION

The invention is concerned with a novel method of identifying and checking the authenticity of articles of non-conductive sheet material capable of allowing microwave radiation impinging thereon to pass therethrough (and preferably such articles which are in paper sheet form e.g. banknotes, passports and bonds), which articles are marked for identification purposes by the incorporation therein of a small quantity of very thin conductive fibres which are capable of absorbing and reflecting certain substantial proportions of the energy of microwave radiation impinging thereon. There articles are hereinafter referred to as "marked articles as herein defined".

According to one feature of the present invention, there is provided a method for producing an identification signal for marked articles as herein defined and checking their authenticity wherein the part of the article in which the very thin conductive fibres are incorporated is placed in the path of an unguided microwave beam and the excess of microwave radiation energy arrested over the energy reflected is measured, and an output signal is produced which is representative of the presence of such excess.

According to a still further feature of the present invention, there is provided apparatus for use in a method according to the invention as hereinbefore defined, which apparatus comprises an emitter of an unguided beam of microwaves; means for positioning the article to be identified with the part of the sheet article in which the very thin conductive fibres are incorporated in the path of an unguided microwave beam from the said emitter; a first receiver positioned so that in use it receives energy from the part of the said beam which passes through the said article and is neither absorbed nor reflected; a second receiver positioned so that in use it receives energy from the part of the said beam which is reflected by the very thin conductive fibres incorporated in the said article; and a comparator connected to the output of both receivers, adapted to deliver an output signal in response to a significant excess of the energy arrested, as measured by the first receiver, over the energy reflected, as measured by the second receiver. The energy arrested is the energy which is neither absorbed nor reflected, and is measured by the reduction of received energy by the first receiver with respect to the energy received in absence of the sheet article.

The marked articles as herein defined which are in paper sheet form are themselves novel articles. Thus, according to a still further feature of the present invention, there are provided articles of paper sheet material capable of allowing microwave radiation impinging thereon to pass therethrough, which articles are marked for identification purposes by the incorporation therein of a small quantity of very thin conductive fibres which are capable of absorbing and reflecting certain substantial proportions of the energy of microwave radiation impinging thereon.

When using a microwave beam for the detection of metallic material, it is common simply to measure the proportion of the energy of the beam reflected by the metallic material. This would however be unsuitable as a reliable means of identification for use in the method of the present invention because the reflection characteristics of a particular article could too easily be copied e.g. by the use of metal powders or reflecting strips. The property of absorbing a detectable proportion of the energy of a microwave beam is however one which is characteristic of very thin conductive fibres, and for this reason it is important in the method according to the invention to measure the proportion of the energy of the microwave beam which is absorbed. This is characteristic of the very thin conductive fibres in the articles and is not easy to imitate.

In the method according to the invention the proportion of the energy of the microwave beam which is absorbed is measured in an indirect way, by measuring the proportion of microwave energy which passes through the article or a selected part thereof (and thus the proportion of microwave energy arrested by the article or part thereof) and separately measuring the proportion of microwave energy reflected. The energy that is arrested but not reflected is then the energy absorbed. The energy arrested by the conductive fibres in the article can be calculated by measuring the reduction in the energy of the beam after passing through the article and comparing this with the reduction observed using a similar reference article but without the conductive fibres. The energy arrested by the reference article can then be set as the reference zero value for direct reading of the energy arrested by the conductive fibres. In a similar way the energy reflected by the conductive fibres in the article can be calculated by comparing the energy reflected by the article with the energy reflected by the reference article. The absorbed energy is then the difference between these two values of energy arrested and energy reflected.

In utilising the method according to the invention to check the authenticity of articles, care must be taken in two respects. First, the measured values of energy arrested and energy reflected are in general large as compared with their difference. If these values are not measured in an accurate way, i.e. with only small probabilities of error, their difference proportionally presents too large variations to be significant as a measure of energy absorbed. When the microwaves are guided inside a waveguide which is traversed by the article clamped between two waveguide sections and the energy transmitted through and reflected by the article are measured, the errors in the measurements are in general too large. When the microwaves are emitted by an emitter antenna so as to form an unguided beam (i.e. without surrounding waveguide) which passes through the article towards a first receiver antenna and which is reflected by the article towards a second receiver antenna, however, then it has been found to be possible to measure the proportions of the energy which pass through and are reflected by the article (and thus also the energy which is absorbed by the article) with sufficient accuracy for the purpose of the method according to the invention.

The second point which requires care when practising the present invention is the selection of very thin fibres having appropriate resistivity in order to provide the desired capability of absorbing and reflecting substantial proportions of the energy of microwave radiation impinging thereon. The fibres, when under a microwave beam, act as dipole antennae. The absorption improves as the fibres become longer and thinner, but there are practical limits. For example, when very thin metallic fibres are to be incorporated into paper sheet, it appears to be desirable, for ease of mixing of the fibres with the sheet material, that the fibres have a length not greater than 40 mm and, to avoid undue expense in manufacture, a thickness of not less than 2μ. Fibres are in general conveniently used which have a thickness below 50λ, preferably in the range from 2 to 25μ, and a length not greater than 40 mm, preferably not greater than 10 mm. The internal resistivity of these fibres must be such as to provide, when operating in use as dipole antennae, a load impedance which is adapted relative to the entrance impedance so as to give sufficient absorption. For the microwave frequencies of 1 to 50 GHz which are in practice used and fibres with the above-mentioned dimensions, it has been found to be important to use for the fibres a metal having a conductivity of less than 10% of the conductivity of the copper standard (copper resistivity=1.7 μΩcm). Such metals are, for example, nichrome, titanium, silicon steel and stainless steel (73 μΩcm).

BRIEF DESCRIPTION OF THE DRAWING

The invention will now be further described with reference to the accompanying drawing, which shows a schematic view of an apparatus according to the present invention.

DESCRIPTION OF THE PREFERRED EMBODIMENT

Figure 1:
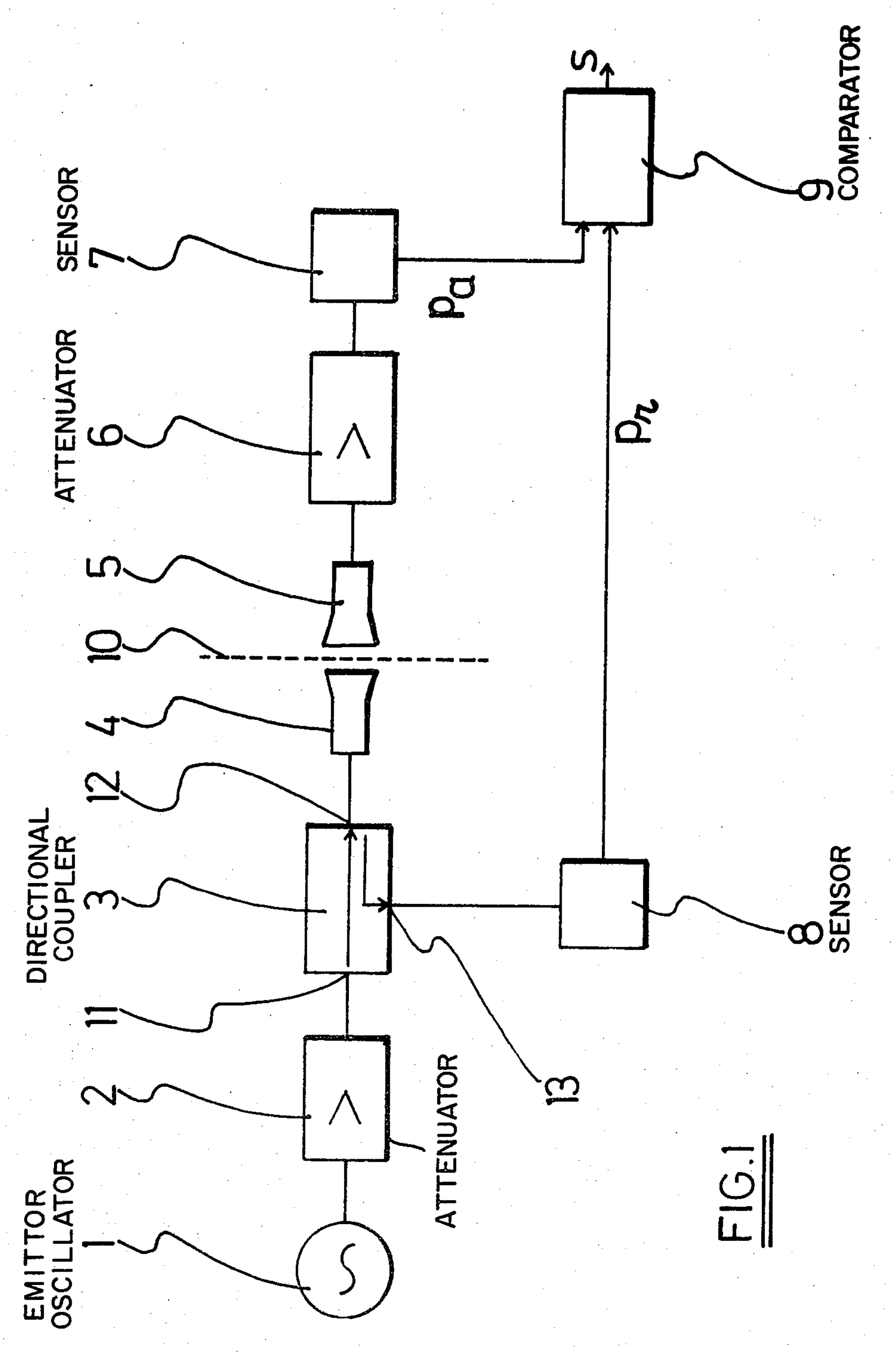

In the drawing, the apparatus comprises an emitter oscillator 1, a variable attenuator 2, a directional coupler 3, an emitter-receiver antenna 4, a receiver antenna 5, a variable attenuator 6, a sensor 7 for the transmitted waves through the sheet article 10 in the gap between the antennae 4 and 5, and a sensor 8 for the waves which are reflected by the sheet article, re-enter antenna 4 and are directed by directional coupler 3 towards the sensor 8. The apparatus also comprises a comparator 9 which compares the value of the energy arrested $P_a$, as measured by sensor 7, with the value of the energy reflected $P_r$, as measured by sensor 8, and which delivers a signal S in response to a significant excess of $P_a$ over $P_r$.

In this embodiment, the emitter-oscillator 1 is a klystron, which generates microwaves of 9,500 Megahertz (wavelength about 3 cm). Alternatively, however, the oscillator can also be a Gunn-oscillator with a Gunn-diode in a resonant cavity for producing microwaves of similar wavelength. Oscillators such as the MA-86651C oscillator of Microwave Associates, Inc., are commercially available for burglar alarms, traffic control devices and other applications. The output of the resonant cavity is provided with a variable attenuator 2, which in this case is a small slot in a plate perpendicular to the direction of the waves at the output of the resonant cavity and which is rotatable in its plane for placing the slot approximately parallel with the E-field of these waves.

The output of the oscillator with this attenuator is connected to a directional coupler HPX752A of Hewlett Packard, which is of the type where two adjacent waveguide sections have coupling holes in the common wall. One of the waveguides forms the transmission line from the output of the oscillator 1 and its attenuator 2 to the horn-antenna 4, i.e. from port 11 to port 12 of the directional coupler. The other waveguide has its end on the side of port 12 terminated with a matched load, and the other end forms port 13, as well known for this type of directional coupler. The directivity of this directional coupler is more than 40 dB, this being the proportion of the signal received at port 13 in response to an input signal at port 12, as compared with the signal received at the same port when the same input signal is applied at port 11. The coupling factor is about 3 dB, this being the energy loss of an input signal at port 12 travelling to port 13. Other directional circuits can be used, such as a ferrite circulator, commonly used in microwave transceivers for microwave reflection control systems.

The output of the directional coupler 3 is provided with a horn antenna 4, which serves for adapting the impedance of the transmitting system to the impedance of the free space in which the antenna 4 emits a nearly parallel unguided beam of microwaves through the sheet article 10. The microwaves reflected by this sheet article enter the horn antenna 4 again in the opposite direction; the horn antenna 4 thus also acts as the antenna for the receiver of the reflected waves. These waves are further transmitted over entrance port 12 to output port 13 of the directional coupler and thence towards the sensor 8 for the reflected waves.

The sensor 8 consists of a point contact diode, placed in the direction of the electric field at the end of a short waveguide section and connected to a suitable load resistance (e.g. diode MA-41205 of Microwave Associates Inc. with a load of 600Ω). The waves entering the sensor produce a DC-voltage across the load resistance, and this voltage is representative of the energy reflected. The voltage delivered by the point contact diode varies approximately as the square of the amplitude of the entering waves, and as the energy of these waves is also proportional to the square of the same amplitude, it can be concluded that in this case the voltage measured across the load is practically proportional to the energy of the entering waves. This feature is however not necessary for a sensor for use in apparatus according to the present invention insofar as the output of the sensor delivers a signal, analog or digital, proportional or not, which is representative of the value of the reflected energy i.e. provides a means of determining the magnitude $P_r$ of that energy. Schottky diodes can e.g. also be used as sensors for this purpose.

At the side of the sheet article 10 which is remote from horn-antenna 4 is located another horn-antenna 5 which acts as the antenna of the receiver of the waves transmitted through the sheet article. This antenna is connected via a variable attenuator 6, of the same type as attenuator 2, to the microwave sensor 7, of the same type as sensor 8, which delivers at its output a signal representative of the energy transmitted through the sheet article 10.

For the purpose of concluding whether or not there is absorption of a proportion of the microwaves impinging on sheet article 10, the readings of the output signals at sensors 7 and 8 are sufficient, even without attenuator 6. For this, a reference sheet article is placed between horn antennae 4 and 5, this sheet article being the same as the sheet article to be identified except that it does not have conductive fibres incorporated therein. The attenuator 2 is set so as to make the sensor 7 deliver its full scale voltage, in this case 200 mV. Then, a completely conducting metallic sheet, which reflects all microwave energy impinging thereon, is placed between the horn antennae 4 and 5 in place of the reference sheet article and the reading of the voltage at sensor 8 (in this case 119 mV) is taken as the full scale voltage for all the energy of the microwave beam being reflected. Finally, the sheet article to be identified is placed between the horn antennae 4 and 5 in place of metallic sheet. The output signal at sensor 7 will give a reading of which the percentage voltage drop (with respect to the full scale of 200 mV), is representative of the percentage of energy arrested by the conductive fibres of the sheet article to be identified. The percentage voltage rise above zero (100 percent being the full scale 119 mV voltage for the energy reflected) is representative of the percentage of energy reflected. The difference between percentage arrested and percentage reflected is then percentage absorbed.

In order however to detect absorption in an automatic way, the additional attenuator 6 and a comparator 9, connected to the outputs of the sensors 7 and 8 of both receivers, are used. The apparatus is then operated as follows. First the metallic sheet is placed between the horn antennae and the attenuator 2 is set so as to allow sensor 8 to display its full scale reading. Then the reference sheet article is placed between the horn antennae and the attenuator 6 is set to display the same full scale reading. In such a way, for both sensors, a voltage rise or drop corresponds with a same rise or drop of energy received. The voltage drop of sensor 7 is proportional to the power arrested $P_a$, and the voltage rise of sensor 8 is then proportional to $P_r$, the power reflected, with the same proportionality factor. When there is no absorption, $P_a$ and $P_r$ must be equal to each other, and this comparison is made in comparator 9. The displays of sensors 7 and 8 are preferably made as digital voltmeters, and the comparator 9 is then of the digital type as well known in the art. When there is a significant excess of the reading of $P_a$ over $P_r$, the comparator can be arranged to deliver a signal S which means that the sheet article to be checked has been identified as authentic. By significant excess is meant an excess beyond the variations to be expected as a result of the probabilities of error involved in making the measurements.

For automatic detection, the attenuator 6 can be omitted if the volumeters of the comparator are made to take into account the difference of scale factors in the voltages produced in both sensors. This can be done e.g. by the use of scale amplifiers at the outputs of the voltage measuring devices, or in a digital way in the comparator.

The apparatus according to the invention can also if desired include a comparator 9 wherein the output signal S is not merely a yes or no, but a signal which indicates the value of the difference between $P_a$ and $P_r$. In such a way, microwave energy absorbing sheet articles can not only be distinguished from non-absorbing sheet articles, but two microwave energy absorbing articles can be distinguished from one another. Thus for example, one category of article can be provided with conductive fibres giving a certain value of absorption loss and a second category of article can be provided with conductive fibres giving a significantly different value of absorption loss. Alternatively, different categories of article can be made to give the same absorption loss but different reflection losses. In such a way identifiable distinctions can be provided between different categories of sheet articles, identification then being possible by measuring not only the value of the energy absorbed but also the value of the energy reflected and both values in combination giving the means of distinguishing different categories of sheet articles. Apparatus of this kind can then serve as machines for sorting different categories of sheet articles.

As microwave signals have a very high speed of response, speeds of more than 10 meters per second are possible for the passage of sheet articles between the horn antennae 4 and 5 without the risk of confusing microwave signals resulting from adjacent paper sheet articles as they pass through the apparatus.

The distance between the horn antennae 4 and 5 is preferably a fraction of a wavelength and the sheet article is preferably passed through the apparatus in a direction at right angles to the beam direction. In general, it is not necessary (although preferable) that the receiving antenna of the first receiver be so positioned as to receive substantially the whole of the transmitted beam. Similarly it is not necessary (although preferable) that the receiving antenna of the receiver for the reflected microwaves, which may be an antenna separate from the emitter antenna, be placed in a position to receive substantially the whole of the reflected beam; nor is it necessary (although it is again preferable) that substantially the whole of the microwave beam should impinge on the sheet article when in position for checking. The only necessary thing is that the values of $P_a$ and $P_r$ which are compared with each other must relate to the same part of the paper sheet article, which part must have conductive fibres incorporated therein. For a good sensitivity, however, the above-mentioned features which are not necessary although preferable are used in carrying out the method according to the invention.

When using the method according to the invention, the conductive fibres in the sheet articles act as small dipole antennae with respect to the incident microwave beam. When these are randomly oriented in the plane of the sheet article, there is always a certain proportion of the fibres or fibre parts aligned with the E-field of the incident beam. If the fibres are not randomly oriented, the method will give different readings for different orientations of the sheet article and this must then be taken into account.

As explained above, the absorption is greater as the conductive fibres become longer and thinner. For this reason the fibre thickness is always lower than 50$\mu$, and this is the intended meaning of the expression "very thin" as used herein in relation to the fibres. A fibre thickness below 25$\mu$ is in general preferred; the absorption is then sufficient to allow sheet articles according to the invention to have less than 5% by weight of fibres. This is what is meant by the expression "small quantity" as used herein in relation to the amount of fibres incorporated into the articles according to the invention. A quantity of less than 0.5% by weight will be preferred.

The very thin conductive fibres for use in the present invention can be obtained for example by the technique of bundle drawing as described e.g. in U.S. Pat. Nos. 2,050,298; 2,215,477; 3,029,496; 3,277,564; 3,698,863; and 3,394,213. As explained in these patents a number of fine wires, drawn in a conventional way to a diameter of e.g. 0.2 millimeter, are bundled together with a separation material between them and a metal casing around the bundle. The whole is then drawn in a number of passes through drawing dies of gradually smaller diameter, and the total reduction of the diameter is then equally distributed over the wires of the bundle. After drawing, the bundle is then submitted to a selective etching operation in which the casing and the separation material between the wire are etched off and the fine filaments remain for subsequent cutting into fibres. The separation material serves to avoid cold welds between filaments during drawing.

The sheet articles according to the present invention are paper sheet articles. These can be made by conventional methods starting from an aqueous suspension of cellulosic fibres together with other paper ingredients and additives including for example polyvinyl acetate and other synthetic fibres. The conductive fibres are evenly distributed in this aqueous suspension. If difficulties in effecting even distribution arise, the fibres can firstly be introduced in the form of conglomerates of various fibres combined together, preferably in the form of bundles, by means of a water-soluble binder. During mixing, the binder then gradually dissolves and the fibres more readily disperse to provide an even distribution.

For different percentages by weight of fibres and different fibre dimensions, the following values were measured (average of 5 measurements: average±-spread)

| Length mm | Diameter μ | Percentage by weight % | % arrested | % reflected |
|---|---|---|---|---|
| 5 | 12 | 4 | 85.4 ± 0.75 | 71.4 ± 3.2 |
| 5 | 12 | 1 | 32.5 ± 3.25 | 29.2 ± 3 |
| 5 | 22 | 4 | 19.0 ± 1.7 | 15.0 ± 1.34 |
| 3 | 22 | 4 | 9.0 ± 0.7 | 7.9 ± 0.7 |

This table shows how important it is to have a method of measurement giving a low probability of error for the measured values. As absorption becomes less (e.g. due to shorter, thicker or fewer conductive fibres), it becomes increasingly difficult to establish whether there is a significant excess of arrested energy over reflected energy, i.e. whether the difference as between arrested energy and reflected energy is more than could result from errors in measurement. The lower the probability of error in the method of measurement, the fewer, the shorter and the thicker can the conductive fibres be. Fewer fibres are in general desirable in order not to alter the appearance and properties of the paper. Shorter fibres are desirable for better mixability e.g. in aqueous suspension for producing paper sheet articles. Thicker fibres require fewer drawing operations to produce and thus are in general cheaper to manufacture.

What is claimed is:

1. A method of producing an identification signal for a sheet article of non-conductive material, which article is marked for identification purposes by the incorporation therein of a small quantity of very thin conductive fibers which are capable of absorbing and reflecting certain substantial proportions of microwave radiation energy impinging thereon, which comprises placing the part of said article in which the very thin conductive fibers are incorporated in the path of an unguided microwave beam, measuring the excess of microwave radiation energy arrested over the energy reflected and producing an output signal which is representative of the presence of such excess.

2. A method according to claim 1 wherein the said output signal is representative of the value of such excess, and in which additionally the energy reflected is measured and transformed into a second output signal which is representative of the value of the energy reflected.

3. A method according to claim 1 or 2 wherein the sheet articles used are paper foils in which said fibers have a length not greater than 40 mm and a thickness below 50μ, and have a conductivity of less than 10% of the copper standard, and in which said paper has less than 5% by weight of said fibers.

4. A method according to claim 3 wherein said fibers are equally distributed and randomly oriented in the plane of the sheet article.

5. A method according to claim 3 wherein said fibers are made of stainless steel.

6. Apparatus for use in a method according to claim 1 which comprises an emitter of an unguided beam of microwaves, means for positioning the article to be identified with the part of the sheet article in which the very thin conductive fibers are incorporated in the path of an unguided beam from the said emitter, a first receiver positioned so that in use it receives energy from the part of said beam which passes through the said article and is neither absorbed nor reflected, a second receiver positioned so that in use it receives energy from the part of the said beam which is reflected by the very thin conductive fibers incorporated in the said article, and a comparator connected to the output of both receivers, adapted to deliver an output signal in response to a significant excess of the energy arrested, as measured by the first receiver, over the energy reflected, as measured by the second receiver.

7. Apparatus according to claim 6 wherein said emitter and first receiver comprise a horn-antenna, placed at a distance of maximum one wavelength from each other, the antenna of the emitter being connected via a directional coupling toward a sensor for measuring the microwaves entering said antenna, which constitutes additionally the antenna of the second receiver.

8. Paper sheet article adapted for being treated by a method according to claim 1 wherein said article is capable of allowing microwave radiation impinging thereon to pass therethrough, which article is marked for identification purposes by the incorporation therein of a small quantity of very thin conductive fibers which are capable of absorbing and reflecting certain proportions of the energy of microwave radiation impinging thereon.

9. A paper sheet article according to claim 8 having less than 5% by weight of said fibers which have a length not greater than 40 mm and a thickness below 50μ, and have a conductivity of less than 10% of the copper standard.

10. A paper sheet article according to claim 9 wherein said fibers are equally distributed and randomly oriented in the plane of the foil.

11. A paper sheet article according to claim 9 or 10 in which said fibers are made of stainless steel.

* * * * *